United States Patent [19]

Dubots et al.

[11] Patent Number: 4,594,218
[45] Date of Patent: Jun. 10, 1986

[54] METHOD OF PRODUCING MULTIFILAMENT LENGTHS OF SUPERCONDUCTOR FROM TERNARY CHALCOGENIDES OF MOLYBDENUM

[75] Inventors: Patrick Dubots, Neauphle le Chateau; Jean-Claude Renard, Chilly Maxarin, both of France

[73] Assignee: Alsthom-Atlantique, S.A., Paris, France

[21] Appl. No.: 744,490

[22] PCT Filed: Oct. 18, 1984

[86] PCT No.: PCT/FR84/00234
§ 371 Date: Jun. 6, 1985
§ 102(e) Date: Jun. 6, 1985

[87] PCT Pub. No.: WO85/01837
PCT Pub. Date: Apr. 25, 1985

[51] Int. Cl.$^4$ .............................................. B22F 3/00
[52] U.S. Cl. ........................................ 419/4; 29/33 F; 29/527.4; 57/9; 72/286; 140/71 R; 148/31.5; 174/126 S; 228/126; 427/117; 428/558
[58] Field of Search ................ 419/4; 29/527.4, 33 F; 148/31.5; 57/9; 72/286; 140/71 R; 174/126 S; 228/126; 427/117; 428/558

[56] References Cited

U.S. PATENT DOCUMENTS

| | | | |
|---|---|---|---|
| 2,873,518 | 2/1959 | Schilling et al. | 419/4 |
| 2,888,740 | 6/1959 | Danis | 419/4 |
| 3,066,407 | 12/1962 | Toensing | 419/4 |
| 3,271,849 | 9/1966 | Price et al. | 419/4 |

FOREIGN PATENT DOCUMENTS 0073128  8/1982  European Pat. Off. .

*Primary Examiner*—Stephen J. Lechert, Jr.
*Attorney, Agent, or Firm*—Kenyon & Kenyon

[57] ABSTRACT

The present invention concerns superconductor lengths constituted by superconducting filaments based on a ternary chalcogenide of molybdenum ($PbMo_6S_8$) assembled within a stabilizing matrix based on copper. The invention provides a method of fabricating superconducting filaments consisting of mixing a powder of a ternary chalcogenide of molybdenum with a metal powder of smaller granulometry and chosen from the components of the chalcogenide in question, or from the group of metals consisting of aluminum, silver, gallium, rhenium, and titanium, in sheathing the mixture of powders obtained by means of a metal wall constituted from one of a group of metals formed by molybdenum, niobium, tantalum, titanium and vanadium, and in subjecting the superconducting lengths obtained after drawing and cold working using conventional wire drawing techniques to a final heat treatment consisting of heating to a temperature of about 800° C. for at least twenty hours.

5 Claims, No Drawings

METHOD OF PRODUCING MULTIFILAMENT LENGTHS OF SUPERCONDUCTOR FROM TERNARY CHALCOGENIDES OF MOLYBDENUM

The present invention relates to lengths of superconductor constituted from superconducting filaments based on ternary chalcogenides of molybdenum, and assembled within a stabilizing metallic matrix which is not superconducting, is based on copper, and serves to evacuate the heat generated, and which constitutes and electrical shunt for regions of superconducting filaments which have lost their superconducting state by virtue of local heating.

Attempts have been made to make superconductive filaments from ternary chalcogenides of molybdenum of the form $M_xMo_6X_8$ (often called "Chevrel phases"), in which M may be a 3d element, an alkali, an alkali earth, a rare earth, silver, cadmium, indium, tin, or lead, in which x varies in the range 1 to 4 depending on the element M, and in which X is one of the elements sulfur, sodium, selenium, or tellurium. These materials are used because of their extremely high critical field which is much higher than that of niobium titanium. The attempts have mostly been performed on the highest performance compound $PbMo_6S_8$, but they have not led to the critical current densities that could be expected from the superconducting properties shown by solid samples.

Because of their special crystallographic structure, Chevrel phases are not ductile, and they must be used in the form of a powder when making superconducting filaments. Further, they are polluted by copper and must be protected therefrom by an appropriate metal sheath. Various tests have been performed in which $PbMo_6S_8$ powder has been compacted in sheaths made of silver, molybdenum, niobium, lead, or tantalum which sheaths are surrounded on the outside by copper and are then drawn or swaged by conventional cable-making techniques. During these operations, the Chevrel phase loses its superconducting properties, but it recovers them in the grains of the powder after heat treatment at 800° C. for a few hours. It seems that the current density in a filament remains low because of voids between the grains of powder. This defect could theoretically be removed by sintering; however the sintering temperature (greater than 1100° C.) is incompatible with the presence of copper in the stabilizing matrix.

The aim of the present invention is to mitigate the above defect and to provide lengths of superconductor based on Chevrel phases having high critical current densities without requiring a final heat treatment that is incompatible with the presence of copper.

The present invention provides a method of manufacturing lengths of superconductor, the method consisting of mixing a second powder with the Chevrel phase powder used for making the superconducting filaments, the second powder having a smaller granulometry than the Chevrel phase powder and being chosen from the components of the Chevrel phase being used or from the group of metals consisting of aluminum, silver, gallium, rhenium and titanium, in sheathing this powder mixture in a metal wall to protect the Chevrel phase from copper, the wall metal being chosen from the group of metals consisting of molybdenum, niobium, tantalum and vanadium, and in subjecting the length of superconductor obtained after swaging the superconductive filaments within a copper based stabilizing matrix to a final heat treatment consisting of heating to a temperature of about 800° C. for a period of at least twenty hours.

The metal wall enclosing the outer mixture and protecting the Chevrel phase from the copper of the stabilizing matrix is advantageously coated on the inside with a metal layer for ensuring good electrical contact, said layer metal being chosen from the group of metals consisting of aluminum, silver, gallium, rhenium, and titanium.

Other characteristics and advantages of the invention appear from the following description of an example of manufacturing a length of superconductor constituted by superconducting filaments based on the Chevrel phase of the $PbMo_6S_8$ type with silver powder added thereto and existing within a copper stabilizing matrix.

The $PbMo_6S_8$ Chevrel phase is synthesized from a mixture in stoichiometric proportions of powder components having a granulometry of 10 to 20 $\mu$m, which is compressed and placed in tubes of vacuum-sealed silica, raised to a temperature of about 1400° C. for about ten hours, and then slowly cooled.

The sintered product thus obtained is then crushed into a powder having an average granulometry of about 20 $\mu$m. This $PbMo_6S_8$ type Chevrel phase is mixed with silver powder having an average granulometry of 1 $\mu$m, and with the silver powder constituting from twenty to thirty percent or more of the mixture. The powder is thoroughly mixed by overall shaking, and is compacted, for example, by isostatic means to reduce its degree of porosity. This compacting provides rods which may have a diameter of about 6 mm, for example. The rods are then inserted into a niobium tube having an outside diameter of 8 mm and whose interior is silver plated to a thickness of about 20 $\mu$m. The assembly is then inserted in a copper tube having an outside diameter of 10 mm. This assembly constitutes a "0 stage" and is hermetically sealed in a vacuum and then cold drawn.

It may be directly reduced to its diameter in use, e.g., 0.3 mm, and then be subjected to the final heat treatment.

Alternatively, it may be reduced to a diameter of about 2.5 mm and then cut up into bars which are inserted into a 10 mm diameter copper tube to constitute a "1 stage" which is again placed in a vacuum, hermetically sealed, and cold drawn. This operation may be repeated several times to constitute a length having from twenty to two hundred or more superconducting filaments embedded in a stabilizing copper matrix.

Once the resulting length has been brought to its final diameter, it is heated to sinter and regenerate the superconducting phase at a temperature of about 800° C. for a period of at least two hundred hours.

The silver powder added to the $PbMo_6S_8$ powder occupies the voids between the $PbMo_6S_8$ grains and diffuses into the grains during the final treatment to constitute at their zones of contact with the untransformed components (molybdenum, sulfur) a Chevrel phase of the $Ag_{1.6}Mo_6.4S_8$ type to ensure superconducting continuity between the grains.

Instead of using silver powder, it is possible to use a powder of gallium which is known as a doping agent for $PbMo_6S_8$ or a powder of aluminum or titanium which are known for not degrading the superconducting properties of $PbMo_6S_8$. It is also possible to use a powder of each of the component elements of the $PbMo_6S_8$ Chevrel phase, i.e., lead, molybdenum and sulfur, providing that the starting product giving rise to the PbMo$_6$S$_8$ was in non-stoichiometric proportions so that stoichiometric proportions are re-established by the final mixing of powders.

The niobium tube acts as an anti-diffusion barrier which protects the Chevrel phase from the copper. It could be replaced by molybdenum, tantalum, titanium or vanadium.

The internal silver plating of the niobium tube which acts as a contact barrier may be replaced by a layer of another metal such as aluminum, gallium, rhenium, or titanium which does not pollute the Chevrel phase and which provides good electrical contact.

Without going beyond the scope of the invention, it is possible to modify various dispositions or to replace certain means by equivalent means.

We claim:

1. A method of making lengths of superconductor from ternary chalcogenide of molybdenum wherein the method comprises:

mixing a powder of a chalcogenide of molybdenum having superconducting properties with a powder of smaller granulometry and chosen from the group consisting of the components of the particular ternary chalcogenide of molybdenum being used, aluminum, silver, gallium, rhenium and titanium;

sheathing the mixture of powder obtained by means of a metal wall for protecting the ternary chalcogenide of molybdenum from copper pollution, the said metal wall being made from one of the group of metals consisting of molybdenum, niobium, tantalum, titanium and vanadium;

drawing and cold working the sheathed mixture of powder by conventional cable-making techniques to form a superconducting length; and heating said superconducting length to a temperature of about 800° C. for at least twenty hours.

2. A method according to claim 1 wherein said metal wall enclosing the mixture of powders and protecting the ternary chalcogenide of molybdenum from copper pollution is lined on the inside with a layer of metal chosen from the group of metals consisting of aluminum, silver, gallium, rhenium and titanium.

3. A method according to claim 1 wherein the ternary chalcogenide of molybdenum powder is of the PbMo$_6$S$_8$ type and the powder of smaller granulometry is a silver powder.

4. The method according to claim 3 wherein the metal wall protecting the mixture of the ternary chalcogenide of molybdenum powder of the PbMo$_6$S$_8$ type and the silver powder is lined with a layer of silver.

5. A method according to claim 3 wherein the metal wall protecting the mixture of the ternary chalcogenide of molybdenum powder of the PbMo$_6$S$_8$ type and the silver powder is made of niobium.

* * * * *